United States Patent

Maijers et al.

[15] 3,691,436

[45] Sept. 12, 1972

[54] ELECTRICAL CIRCUIT ELEMENT HAVING A DIAGONAL ABUTMENT STRIP, AND METHOD OF MANUFACTURING THE SAME

[72] Inventors: Andries Cornelis Maijers; Jacob Ketel, both of Emmasingel, Eindhoven, Netherlands

[73] Assignee: U.S. Philips Corporation, New York, N.Y.

[22] Filed: May 11, 1971

[21] Appl. No.: 142,240

[30] Foreign Application Priority Data

May 22, 1970 Netherlands..............7007403

[52] U.S. Cl................317/261, 29/25.42, 174/52 PE, 174/138 G, 264/272

[51] Int. Cl.................................................H01g 1/03

[58] Field of Search..............317/242, 261; 264/272; 174/52 PE, 138 G; 29/25.42; 311/101 C

[56] References Cited

UNITED STATES PATENTS

| | | | |
|---|---|---|---|
| 3,117,297 | 1/1964 | Degier | 317/261 X |
| 3,129,490 | 4/1964 | Rollefson | 317/242 X |
| 3,236,936 | 2/1966 | Robinson | 317/242 X |

*Primary Examiner*—E. A. Goldberg
*Attorney*—Frank R. Trifari

[57] ABSTRACT

An electrical circuit element having an abutment strip of insulating material extending diagonally between the connecting wires and engaging, with its flat sides, the connecting wires and more or less adjoining the circuit element. The circuit element is covered by an insulating lacquer extending from the circuit element up to the abutment strip, but does not cover that side of the abutment strip which is remote from the circuit element.

4 Claims, 3 Drawing Figures

INVENTORS
ANDRIES C. MAIJERS
JACOB KETEL

BY

Frank R. Trifari
AGENT

ELECTRICAL CIRCUIT ELEMENT HAVING A DIAGONAL ABUTMENT STRIP, AND METHOD OF MANUFACTURING THE SAME

The invention relates to an electrical circuit element covered by a layer of insulating material through which two substantially parallel connecting wires of the circuit element protrude. An abutment member consisting of insulating material extends between the connecting wires.

One problem with electrical circuit elements, for example, capacitors, is that the circuit element does not have a defined abutment, necessary for uniform mounting on a printed circuit board. This is due to the irregular shape which the circuit element acquires upon dipping in an insulating lacquer. This problem becomes particularly significant when circuit elements are mounted by machine. This problem has been solved by means of a plate provided with apertures for the connecting wires which, prior to dipping, is slid over the connecting wires as far as the portion of the circuit element extending between the connecting wires. After that, the circuit element is dipped into the lacquer to a depth such that the lacquer extends from the circuit element to the plate, but does not cover the side of the plate remote from the circuit element in order to avoid lacquer on the connecting wires. This uncovered side of the plate thus forms a flat, defined abutment for mounting on a printed circuit board. One of the drawbacks of the above described circuit elements is that each circuit element has to be individually provided with a plate. The plate must be fitted very accurately so as to prevent bending of the connecting wires and damaging of the fixation of the connecting wires to the circuit element. A further drawback is that, owing to the presence of the plate, the insulating lacquer is prevented from completely penetrating that portion of the surface of the circuit element which surrounds the connecting wires, so that proper insulation is not ensured. Another drawback is that the above described method of manufacturing the circuit element is less suitable for automation because the abutment plates have to be individually fitted with great accuracy. Series production of these circuit elements leads to a comparatively high cost price per circuit element.

One of the objects of the invention is to provide a circuit element in which the said drawbacks are eliminated.

To this end, the invention is characterized in that the abutment member consists of a strip of insulating material arranged diagonally between the parallel portion of the connecting wires. Its flat sides engage the connecting wires and more or less adjoining the circuit element at the area of the surface of the circuit element situated between the connecting wires. The strip is embedded in the insulating material substantially as far as the side remote from the component.

A further object of the invention is to provide a method of manufacturing circuit elements according to the invention enabling series production of comparatively inexpensive circuit elements.

To this end the invention is further characterized in that a chain of circuit elements is formed, the connecting wires of which extend mutually parallel and transverse to the direction of the chain and engage a continuous strip of insulating material which is common to all circuit elements and which more or less adjoins them and which extends diagonally between the connecting wires. The coherence of the chain of circuit elements is obtained by means of a connecting strip which is common to all circuit elements and on which the circuit elements are mounted. The chain of circuit elements is then dipped into an insulating lacquer to a depth such that each circuit element is covered by the insulating lacquer substantially as far as the side of the strip of insulating material which is remote from that circuit element.

In order that the invention may be readily carried into effect, one embodiment thereof will now be described in detail, by way of example, with reference to the accompanying diagrammatic drawing, in which.

Figure 1:
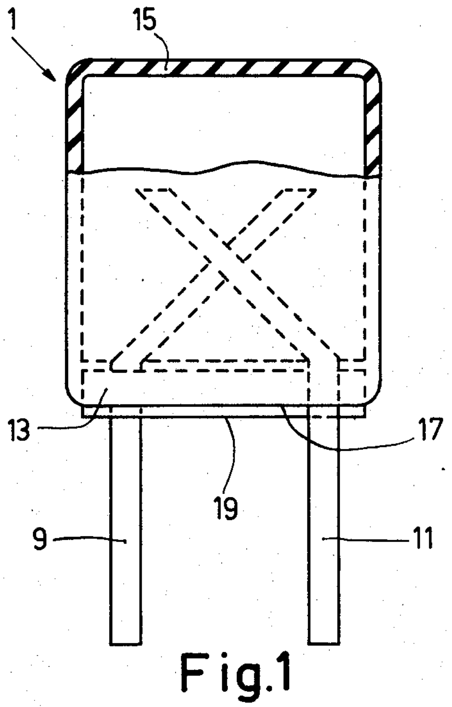
FIG. 1 shows, on a strongly exaggerated scale, an electrical component according to the invention, the upper portion of the element being shown in a sectional view and the lower portion in a front view.
Figure 2:
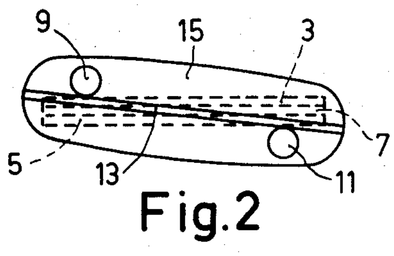
FIG. 2 is an underside view of the circuit element shown in FIG. 1.

The circuit element 1 according to the invention shown in FIG. 1 and FIG. 2 is a disc-shaped capacitor having a layer of ceramic dielectric material 7 which is situated between two disc-shaped electrodes 3 and 5, and two mutually parallel connecting wires 9 and 11 which extend parallel to the electrodes 3 and 5 and are connected to the electrodes 3 and 5, respectively. Diagonally between the connecting wires 9 and 11 is situated a strip 13 of insulating material which engages with its flat sides the side of the connecting wires which faces the dielectric 7. The capacitor 1, including the strip 13 provided thereon, is dipped into an insulating lacquer to a depth such that the lacquer 15 covers the capacitor as far the level indicated by the reference numeral 17, so that the lower side 19 of the strip 13 remains free from lacquer. The strip 13 is thus embedded into the insulating lacquer 15 approximately as far as the level 17. The lower side 19 of the strip 13 constitutes a defined flat abutment for mounting the capacitor on a printed-circuit board. Even though the strip 13 is preferably arranged against the side of the connecting wires 9 and 11 which faces the dielectric 7 on account of the favorable adhesion to the capacitor body, it is also possible to arrange the strip diagonally against the side of the connecting wires which is remote from the dielectric 7.

Even though the invention is illustrated with reference to a disc-shaped ceramic capacitor, it will be obvious that circuit elements of a different shape, for example, cylindrical elements having radially extending connecting wires, can also be provided with an abutment strip as described in the foregoing.

Figure 3:
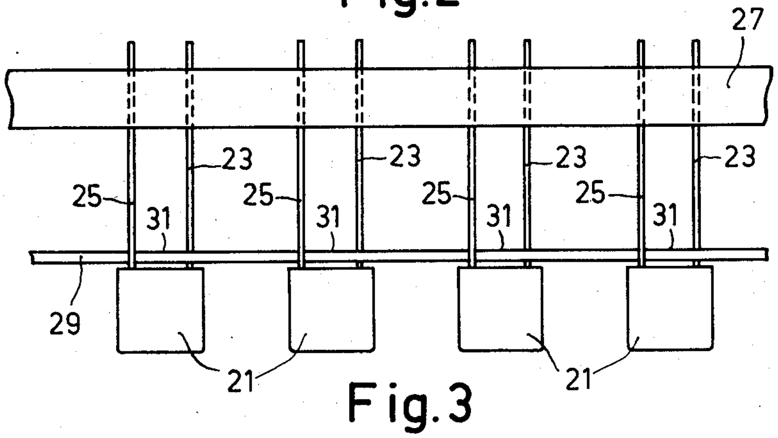
FIG. 3 is a front elevation of a chain of circuit elements, prior to dipping, formed with the aid of a method according to the invention.

Fitting a diagonally-arranged abutment strip and dipping a circuit element may, of course, also be effected individually for each circuit element, but according to the invention this is preferably done for a number of circuit elements simultaneously in the below manner which is described with reference to FIG. 3.

Of a number of, for example, four identical circuit elements 21 a chain is formed by arranging the elements mutually parallel in the same plane, their connecting wires 23 and 25 extending in the same direction transverse to the longitudinal direction of the chain to be formed, and by subsequently interconnecting the connecting wires of the various elements by means of a connecting strip 27. The connecting strip 27 may consist of, for example, a strip of adhesive tape and a further strip between which the connecting wires are secured. More or less adjacent to the sides of the circuit elements 21 from which the connecting wires 23 and 25 protrude, a continuous strip of insulating material 29 is fitted which extends diagonally between the connecting wires 23 and 25 of the circuit elements and which engages with its flat sides the connecting wires 23 and 25. The strip 29 may be woven between the connecting wires 23 and 25 after or before the connecting strip 27 is fitted. If the circuit elements are placed in a suitable holding device, the strip 29 may be slid between the connecting wires of the circuit elements while lying in a flat plane. The mutually parallel connecting lines between the two connecting wires of the various circuit elements then cross the strip 29. If necessary, the circuit elements may be simultaneously tilted after the strip 29 has been fitted so that the connecting wires engage the strip 29. It is further possible to keep the strip 29 in a fixed position and to displace the circuit elements with respect to the strip by means of a holding device. The insulating lacquer is applied by dipping the circuit elements 21 simultaneously in a lacquer bath while they are suspended from the connecting strip 27. The dipping depth is so selected that the lacquer cannot cover the side 31 of the strip 29 which is remote from the circuit elements 21. As a result, the risk of covering the connecting wires with lacquer is also eliminated. Dipping may be effected, for example, by lowering a chain of circuit elements which is situated in a flat plane into the lacquer. However, it is alternatively possible to form the chain of circuit elements into a coil, and to subsequently dip the coil into the lacquer. After drying of the lacquer, the connecting strip 27 may be removed immediately, if desired, for example, by cutting off a portion of the connecting wires, the abutment strip 29 being cut between the circuit elements.

It will be obvious that according to the invention a large number of circuit elements can be provided with an abutment strip in series production in a very simple and inexpensive manner. Also because the fitting of a diagonally extending strip does not require great accuracy, the method according to the invention provides a comparatively inexpensive circuit element provided with an abutment strip.

What is claimed is:

1. An electrical circuit element covered by a layer of insulating material through which two connecting wires of the circuit element protrude, said wires having at least a portion thereof parallel to each other, an abutment member of insulating material extending between said connecting wires, said abutment member comprising a strip of insulating material having flat sides and extending diagonally between the parallel portion of the connecting wires, the flat sides of said abutment member engages the connecting wires and substantially adjoins the circuit element at the area of the surface of the circuit element situated between the connecting wires, said strip being embedded in the insulating material substantially as far as the side remote from the circuit element.

2. An electrical circuit element as claimed in claim 1 wherein said element is a capacitor having a layer of dielectric material which is situated between two plate shaped electrodes, said connecting wires extending substantially parallel to the electrodes, each of the wires being connected to one of the electrodes, said strip of insulating material engaging the side of the connecting wires facing the dielectric.

3. A method of manufacturing an electrical circuit element as claimed in claim 1, comprising the steps of forming a chain of circuit elements, the connecting wires of which extend mutually parallel and transverse to the direction of the chain and engage a continuous strip of insulating material which is common to all circuit elements and which more or less adjoins them and which extends diagonally between the connecting wires, the coherence of the chain of circuit elements being obtained by means of a connecting strip which is common to all circuit elements and on which the circuit elements are mounted, after which the chain of circuit elements is dipped into an insulating lacquer so that each circuit element is covered by the insulating lacquer substantially up to the side of the strip of insulating material which is remote from that circuit element.

4. An electrical circuit element covered by a layer of insulating material through which two connecting wires of the circuit element protrude, an abutment member comprising a strip of insulating material extending between the connecting wires, having flat sides thereof engaging the connecting wires and substantially adjoining the circuit element at the area of the surface of the circuit element between the connecting wires, said insulating material covering said strip up to the side remote from the circuit element.

* * * * *